United States Patent [19]

Hoornstra et al.

[11] 4,072,529

[45] Feb. 7, 1978

[54] GELLED PHOTOPOLYMER COMPOSITION AND METHODS OF MAKING THEM

[75] Inventors: Clayton W. Hoornstra; Violete L. Stevens, both of Midland, Mich.

[73] Assignee: The Dow Chemical Company, Midland, Mich.

[21] Appl. No.: 606,260

[22] Filed: Aug. 20, 1975

[51] Int. Cl.² ............................ G03C 1/68; C08F 8/00; C08G 18/00

[52] U.S. Cl. .................................. 96/115 R; 96/35.1; 96/86 P; 204/159.14; 204/159.15; 204/159.19; 204/159.23; 260/73 R; 260/52; 260/837 R; 260/844; 427/43

[58] Field of Search .................. 96/115 R, 35.1, 86 P; 427/43; 260/73 R, 52, 837, 844; 204/159.14, 159.19, 159.23, 159.15

[56] References Cited

U.S. PATENT DOCUMENTS

| | | | |
|---|---|---|---|
| 3,505,257 | 4/1970 | Conte et al. ........................ | 260/73 R |
| 3,597,313 | 8/1971 | Williams et al. .................... | 260/73 R |
| 3,658,745 | 4/1972 | Merrill et al. ....................... | 260/73 R |
| 3,699,086 | 10/1972 | Moschel et al. .................... | 260/73 R |
| 3,740,376 | 6/1973 | Wolff et al. ......................... | 260/73 R |
| 3,801,328 | 4/1974 | Takimoto et al. .................. | 96/115 P |
| 3,843,612 | 10/1974 | Vogel et al. ........................ | 260/73 R |
| 3,905,819 | 9/1975 | Sakurai et al. ...................... | 96/35.1 |
| 4,006,068 | 7/1977 | Stevens .............................. | 204/159.11 |
| 4,014,854 | 3/1977 | Stevens et al. .................... | 404/159.11 |

*Primary Examiner*—Jack P. Brammer
*Attorney, Agent, or Firm*—David H. Fifield; Glenn H. Korfhage

[57] ABSTRACT

A negative-working, reversibly gelled composition is disclosed, suitable for use as the photocurable component in a blank for preparation of an article in relief, such as a printing plate. Uncured portions of the composition are removed with an aqueous solution following imagewise modulated exposure of such a blank to actinic radiation. The composition comprises a first organic polymer bearing per molecule, at least one ethylenically unsaturated group which is polymerizable by a free radical source; and a second organic polymer bearing per molecule, at least two Z groups, Z being a primary hydroxyl or a mercapto group, with the proviso that when said first organic polymer bears at least two Z groups per molecule, said second organic polymer may be omitted; said Z groups being reacted by contact with a dialdehyde to produce the reversibly gelled composition.

22 Claims, No Drawings

GELLED PHOTOPOLYMER COMPOSITION AND METHODS OF MAKING THEM

CROSS-REFERENCE TO RELATED APPLICATIONS

In Ser. No. 444,078 filed Feb. 20, 1974, now U.S. Pat. No. 4,014,854 by Violete L. Stevens, Arthur R. Sexton, and Frederick P. Corson, compositions are disclosed which are generic to certain intermediates useful in the formulation of the compositions of the present invention. The compounds of said U.S. Pat. No. 4,014,854 are represented by the formula $R[(R'O)_m X]_n$ wherein R is the residue left by removal of $n$ active hydrogen atoms from an initiator compound, $RH_n$; each R' is independently one of various alkylene radicals; each X is independently H or the acyl radical of a carboxylic acid with the proviso that at least one R' is 3-hydroxy-1,2-propylene and at least one is a group of the formula

wherein X is the acyl radical of an $\alpha,\beta$-unsaturated carboxylic acid; and $m$ and $n$ are integers such that the total number of R'O groups is at least 2.

In Ser. No. 573,225 filed Apr. 30, 1975, now U.S. Pat. No. 4,006,068 by Violete L. Stevens, polymercapto compositions are disclosed which are useful in the formulation of the compositions of the present invention.

BACKGROUND OF THE INVENTION

The invention relates to novel compositions which are free radical curable in an imagewise fashion and to an article of manufacture, namely, a blank comprising a layer of said composition which can be exposed to imagewise molulated actinic radiation and developed to form an article in relief, e.g., a relief printing plate. The invention also encompasses methods of forming such a blank and such articles in relief.

Formerly, photosensitive blanks were exposed to actinic radiation, usually in the ultraviolet range, through an image-bearing transparency. Recently, it has been discovered such exposure to actinic radiation can be carried out using computer-controlled, scanning laser beams rather than image-bearing transparencies. Hence, the phrase "imagewise modulated" is used to refer to either of these particular methods of exposure, as well as any others which may be equally suitable.

By "article in relief" is meant a printing plate which depends upon surface relief to transfer a printed image such as is used in letterpress and gravure printing; pattern plates and molds suitable for various forming tasks not necessarily related to printing; decorative surfaces, e.g. on containers, wallpaper, panelling and the like; plaques; jewelry; templates; mechanical parts as in photo machining; and other articles of a similar nature wherein a pattern of radiation is employable to generate a pattern in three dimensions.

Throughout the last two decades or more, letterpress printing using etched plates of zinc or magnesium was by far the printing method most widely employed by publishers of magazines and newspapers, as well as by custom engravers. In recent years, however, the popularity of metal plates has declined in favor of what are generally referred to as plastic printing plates.

Plambeck, Jr., U.S. Pat. No. 2,760,863 (DuPont) is illustrative of the pioneer work done in the early 1950's in the area of plastic printing plates. Since then, many others have made worthwhile contributions to the art, among them being Jennings, U.S. Pat. No. 3,036,914 (DuPont); Roth, U.S. Pat. No. 3,147,116 (GAF); Thommes, U.S. Pat. Nos. 3,202,513 and 3,210,187 (DuPont); Celeste, U.S. Pat. Nos. 3,261,686 and 3,448,089 (DuPont); Suzuki, U.S. Pat. No. 3,556,791 (Asahi) and the patentees referred to therein; Gush et al., U.S. Pat. No. 3,597,080 (W. R. Grace & Co.); Akamatsu et al., U.S. Pat. No. 3,628,963 (Asahi); Takimoto et al., U.S. Pat. Nos. 3,630,746 and 3,801,328 (Nippon Paint); and Kai et al., U.S. Pat. No. 3,794,494 (Asahi).

Currently, blanks for plastic printing plates or printing plate systems are widely marketed by approximately a dozen major firms, more or less. A general summary of many of those currently available can be found in the July, 1972 issue of Japan Plastics Age, pages 19–24. Commercially available plates fall generally into two categories: plates which are prepared from blanks wherein the photocurable layer is a liquid, and plates prepared from blanks wherein the photocurable layer is a solid.

The most severe drawback inherent in all of the liquid systems is that the blanks cannot be prefabricated. Thus, each user must acquire and maintain on the premises, expensive and space-consuming casting equipment. Even then, blanks are subject to considerable variations because of the lack of uniform standards of quality control. Moreover, the liquid systems generally produce an inferior image because the image-bearing transparency is not placed in direct contact with the surface of the liquid.

Blanks of the solid type, on the other hand, generally provide a better image but have heretofore required rather long processing times. A leading brand blank plate, for instance, is regarded by many as providing, under ideal conditions, the best image reproduction of any plastic plate currently on the market. Yet, under recommended conditions, more than ten minutes are required to prepare the plate for direct printing, i.e., from imagewise exposure through post-wash cure, whereas the corresponding steps take less than five minutes using a leading liquid system. Even longer time is required where a pattern plate is desired. (Another brand solid blank can be processed in about six minutes, but because that particular blank must be refrigerated until use, it has severe storage and transportation drawbacks.) Moreover, solid blanks currently on the market generally must be briefly exposed to ultraviolet radiation immediately prior to the imagewise modulated exposure, which brief exposure is believed to act as a scavenger for inhibitors to curing, e.g. oxygen, which may be present in the photosensitive layer. In the trade, this preliminary exposure is known as a "bump," and the extra steps involved in carrying out this bump can add as much as a minute to the total processing time. If this bump is omitted, imagewise exposure to the prior art plates must be increased two- to three-fold, and in some cases no shoulders can be formed to support the image elements even then. In addition to the time factor, most all of the solid type blanks suffer from deficiencies in the physical properties of the cured polymeric relief, more so than plates derived from liquid systems. For example, some become brittle. Some polymeric reliefs soften and swell during washout, in part because of the relatively long time during which the plates are in contact with the wash, and are extremely delicate and prone to damage unless handled with great care at this stage of processing. Non-uniform shrinkage attendant upon drying such swollen polymeric reliefs commonly causes a concave surface configuration as well as other distorted shapes. Some polymeric reliefs are sensitive to atmospheric humidity changes. Also, some are not resilient if deformed and so cannot withstand much accidental abuse without being marred and spoiled.

Thus, a blank is desired having sufficient dimensional, chemical, and thermal stability at ambient temperatures so that it can be prefabricated and readily transported to the user in a condition ready for use. In preparing a printing plate from such a blank, it should not be necessary to bump the blank prior to use, and the steps of imagewise modulated exposure, solvent removal of the unexposed portions of the image, and post-wash curing, which cannot be performed until after the final version of the copy has been determined, should be able to be completed within a short time, e.g., for plates for news publishing, within a total of about five minutes or less, although longer processing times can be tolerated in preparation of other types of articles in relief where time is not so critical. Where a direct printing plate is the article in relief, the cured plate should be sufficiently hard, tough, and durable, e.g., a Shore A hardness of from about 80 to about 95, to resist wear and significant distortion of the image under printing pressure, yet sufficiently yieldable to facilitate mounting on a rotary press without material image distortion. It should, nevertheless, also be slightly compressible so that the printing surface can conform to localized variations in the surface to be printed in much the same manner as an offset blanket, and must also have sufficient resiliency at press temperatures to regain promptly its original configuration upon removal of the deforming force. So far as we are aware, never before has a system been available having all of the foregoing advantages without any of the disadvantages. A crucial factor in the simultaneous attainment of all these respective characteristics in the present invention is the composition of the image layer used in the blank.

SUMMARY OF THE INVENTION

Accordingly, one aspect of the present invention is a composition in a reversibly gelled state, which composition is free radical-curable in an imagewise fashion and thereafter developable to form an article in relief, said composition being prepared by contacting a dialdehyde with:

Component (a), a first organic polymer bearing, per molecule, at least one ethylenically unsaturated group which is polymerizable by a free radical source; and Component (b), a second organic polymer bearing, per molecule, at least two Z groups, wherein each Z is independently primary hydroxyl or mercapto, with the proviso that when Component (a) bears at least two Z groups per molecule, Component (b) may be omitted.

Preferably such a composition meets the proviso stated above so that Component (b) is not required. In a preferred embodiment, Component (a) is represented by the formula

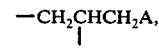

wherein R is the residue left by removal of $n$ active hydrogen atoms from an initiator compound, $RH_n$, each R' independently is an alkylene radical selected from the group consisting of ethylene, trimethylene, tetramethylene, 1,2-butylene, 2,2-bis(halomethyl)-1,3-propylene, and groups of the formula —CH$_2$CHCH$_2$A, each A independently is H, Cl, Br or OX, each X independently is H or the acyl radical of a carboxylic acid with the proviso that at least two R' are 3-hydroxy-1,2-propylene and at least one R' is a group of the formula

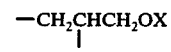

wherein X is the acyl radical of an $\alpha,\beta$-unsaturated carboxylic acid, each $m$ independently is a positive integer and $n$ is an integer from 1 to 8.

In a process of the invention, the reversibly gelled composition mentioned above is prepared by contacting Component (a) and Component (b) or, when Component (a) also bears the minimal two Z groups per molecule, Component (a) alone, with a dialdehyde under gelling conditions, said dialdehyde being present in an amount sufficient to induce gelling of Component (a)-Component (b) mixture, or Component (a) alone, as the case may be.

Another aspect of the invention is an improved blank suitable for preparation of an article in relief, said blank comprising an image layer comprising the hereinabove described composition; and the method for producing same.

Yet another aspect of the invention is the improved process for preparing an article in relief which comprises exposing the image layer of the aforementioned blank to imagewise modulated actinic radiation and thereafter developing the image layer with an aqueous developing solution.

DETAILED DESCRIPTION OF THE INVENTION

A. The Gelled Composition

1. The Organic Polymers:

The reversibly gelled composition of the invention is comprised of Component (a), an organic polymer bearing, per molecule at least one ethylenically unsaturated group which is polymerizable by a free radical source. The nature of the polymeric backbone is not critical and may be selected to give the desired hardness, gel reversibility, toughness, flexibility, impact strength, nondegradation, and compatibility with other components with which it may be utilized before and after free radical-cure. Exemplary of suitable polymeric backbones are polysiloxanes, cellulosics or other polysaccharides, polyoxyalkylenes, polyalkylene imines, straight chain carbon backbones as prepared from olefinically unsaturated polymerizable materials, including polyvinylaromatics, linear polybutadienes, polyvinylhalides, polyvinylalcohols, polyacrylamides, and the like. These organic polymers may be homopolymers or copolymers.

The ethylenically unsaturated group or groups on such a polymer backbone may be inherently present upon formation of the polymeric backbone as is the case for polyunsaturated polyesters as prepared by condensation of one or more unsaturated dicarboxylic acids, e.g. fumaric, maleic, and the like, with a polyalkylene glycol, e.g. ethylene glycol, diethylene glycol, polypropylene glycol and the like, or a straight chain carbon backbone prepared by the linear polymerization of 1,3-butadiene or a polyoxyalkylene prepared by ring-opening polymerization of glycidyl acrylate or methacrylate or allyl glycidyl ether, for example. Alternatively, the ethylenically unsaturated groups may be inserted by the attachment of such unsaturated groups to a polymeric backbone through another functional group associated therewith, e.g., ester or amide formation from condensation of an $\alpha,\beta$-unsaturated carboxylic acid or acid chloride with pendant hydroxyls or amine groups of a polymeric backbone. One such example of this would be the esterification of a polyglycidol with acrylic acid; another, condensation of polyacrylamide with acryloyl chloride. Similarly a polyvinylbenzyl chloride may be condensed with an alkali metal alcoholate, of allyl alcohol for example, or a carboxylic acid condensed with a hydroxyalkylated cellulosic or allyl alcohol condensed with a polyacrylic acid backbone to form an allyl ester. Other suitable organic polymers bearing ethylenically unsaturated groups for use as Component (a) are readily apparent to those skilled in the art and the invention is not limited to the examples previously described.

Component (b) is a second organic polymer bearing, per molecule, at least two Z groups wherein each Z is independently primary hydroxyl or mercapto, provided that when Component (a) bears at least two Z groups per molecule then Component (b) is optional and may be omitted. The polymeric backbone of Component (b) is suitably any of the polymeric backbones described above bearing or capable of modification to bear the required two Z groups per molecule. Cellulosics or hydroxyalkylated cellulosics, linear or branched polyglycidols, polyallylic alcohol, polyvinylbenzyl alcohol and hydroxyalkyl polysiloxanes are suitable examples of polymers which may serve as Component (b) having primary hydroxyls as Z groups. From these examples of Component (b) it is readily apparent that, by esterification with an $\alpha,\beta$-unsaturated carboxylic acid, Component (b) may be modified to meet the requirements of Component (a) thereby eliminating the need to employ Component (b) as a separate entity.

Component (b) wherein Z groups are mercapto groups is suitably any of the polymercaptans prepared by esterification of a polyol by a mercaptocarboxylic acid. Representative materials are those prepared by contacting mercaptoacetic, 2-mercaptopropionic or 3-mercaptopropionic acid with a polyol such as trimethylolpropane, pentaerythritol, a glycol, or with a polyglycidol. Those wherein a mercaptocarboxylic acid, especially mercaptoacetic acid, is employed to esterify one or more glycidol units are preferred in the invention. It is also possible to convert the chloride groups of an epichlorohydrin polymer to mercapto groups by heating with sodium bisulfide monohydrate and sodium sulfide nonahydrate as described in U.S. Pat. No. 3,848,028. A single component bearing both ethylenically unsaturated groups and mercapto groups is prepared at low temperatures due to the reactivity of the two groups. In a preferred embodiment, a polyglycidol is first condensed with mercaptoacetic acid to supply the required mercapto groups, and thereafter contacted with acryloyl chloride at low temperatures on the order of 0°–20° C. Unesterified glycidol units will provide primary hydroxyls too. Where the Z groups are mercapto groups, the term "organic polymer" is intended to include polymercapto compounds such as pentaerythritol tetramercaptoacetate and other polymercaptans. These polymercaptans serve both as gellable components and as crosslinkers for the ethylenically unsaturated groups. Preferred as Component (b) containing mercapto groups are compounds represented by the formula $$R[(R''O)_{\overline{m}}X]_n \qquad \text{(Formula I)}$$

wherein R, X, $m$ and $n$ are as previously defined and R" independently is R' as previously defined or $$-CH_2CHCH_2OY$$
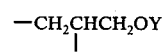

wherein Y is the acyl radical of a mercaptocarboxylic acid or an allyl radical, with the proviso that at least two R" are $$-CH_2CHCH_2OY$$
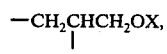

wherein Y is the acyl radical of a mercapto carboxylic acid. In the compounds of formula (I) where one or more R" are $$-CH_2CHCH_2OX,$$

X being the acyl radical of an $\alpha,\beta$-unsaturated carboxylic acid or one or more R" are $$-CH_2CHCH_2OY,$$

Y being an allyl radical, the compound of formula (I) may serve as Component (a) and Component (b) is optional in the invention composition. These compounds of formula (I) are prepared in the manner described below for compounds of formula (II) except that two or more glycidol units are esterified with a mercaptocarboxylic acid. Preferred for this esterification are mercaptoacetic acid and 3- or 2-mercaptopropionic acids.

In a preferred embodiment of the invention, a polyglycidol is utilized which is partially esterified with an $\alpha,\beta$-unsaturated carboxylic acid to provide one component having both the ethylenically unsaturated group and primary hydroxyl groups on a single polymer. In this preferred embodiment, Component (a) may be represented by the formula $$R[(R'O)_{\overline{m}}X]_n \qquad \text{(Formula II)}$$

where R, R', O, X, $m$ and $n$ are as described above. In one preferred embodiment of the compound of formula (II), R is the residue of a hydroxy compound free of groups other than OH that are reactive with an alkylene oxide. Suitable $RH_n$ hydroxy compounds include the alkanols such as methanol, butanol, octanol, dodecanol and octadecanol; the alkenols, such as allyl alcohol, 10-undecen-1-ol, oleyl alcohol and the like; alkylene glycols, such as ethylene, propylene, butylene, 1,4-tetramethylene and 1,3-hexylene glycols; the higher aliphatic polyols such as glycerol, pentaerythritol, sorbitol, sucrose, hexanetriol and the like; phenols such as phenol, cresols, xylenols, hydroquinone, resorcinol, naphthols, bisphenols and the like and aralkanols, such as benzyl alcohol and phenethyl alcohol, and the like. It is preferred that $RH_n$ have not more than 8 active hydrogen atoms, and preferably not more than 4. Especially preferred as $RH_n$ are those wherein R is an aromatic residue and n is 2, for example, basic phenolphthalein, 4,4'-biphenol, 4-mercaptophenol, hydroquinone, and bisphenol A.

The preferred embodiments of Component (a) as described by formula (II) are prepared by acylating the desired proportion of hydroxyl groups in a polyglycidol or a copolymer of one or more alkylene oxides with glycidol, said polyglycidol or copolymer being initiated by the initiator $RH_n$. Within the group of compounds described by formula (II), linear products are preferred. Linear, as used herein, refers to each of the polyoxyalkylene backbone chains attached to the initiator residue, R. Obviously, if n in the above formula exceeds two the molecule as a whole could be considered to be branched. Methods for the production of polyglycidols, polyglycidyl methacrylate and polyglycidyl methacrylate copolymers are described in U.S. Pat. Nos. 2,680,109; 3,509,074; 3,578,719; 3,595,924; 3,446,756; British Pat. No. 1,267,259, and French Pat. No. 1,438,201.

It is preferred to prepare the compounds of formula (II) by forming a polymer or copolymer of tertiarylbutyl glycidyl ether (TBGE), removing the tert.-butyl groups and directly replacing the desired portion of such groups with ester groups by heating the polymer or copolymer with a strong acid catalyst, preferably a sulfonic acid, in the presence of the acid corresponding to a desired ester. Alternatively, the tert.-butoxy groups are removed from the polymer or copolymer by heating same with a strong acid catalyst thus replacing the tert.-butoxy group with hydroxy groups. Any desired portion of the latter can then be esterified with an $\alpha,\beta$-unsaturated carboxylic acid or acid chloride. Any terminal hydroxyls may likewise be esterified.

In a preferred method, TBGE, in conjunction with one or more alkylene oxides if desired, is condensed with an initiator compound and the tert.-butoxy groups then removed and the desired portion of ester groups simultaneously attached by warming the polymer with an arylsulfonic acid or similar catalyst in the presence of sufficient $\alpha,\beta$-unsaturated carboxylic acid to produce the desired proportion of ester groups.

If any substantial part of the acid to be used in the esterification step is a polycarboxylic acid, it is preferably used in the form of its anhydride and in the proportion of one mole of anhydride per equivalent of hydroxyl to be esterified, thus producing a partial ester of an acid. If one attempts to totally esterify such an acid its polyfunctionality causes branching and, ultimately, crosslinking of the polymeric backbone. Moreover, because of the likelihood of transesterification and resultant cross linkage, the polycarboxylic acid anhydride is suitably reacted separately and after the reaction of any monocarboxylic acid.

Suitable monocarboxylic acids for use in preparing the compound of formula (II) include acrylic, methacrylic, $\alpha$-chloroacrylic, crotonic and cinnamic acids. Suitable $\alpha,\beta$-unsaturated polycarboxylic acid anhydrides include maleic, itaconic, citraconic, glutaconic and chloro- and bromomaleic anhydrides. Other suitable anhydrides include those of succinic, adipic, phthalic, trimellitic and hemimellitic acids and the corresponding alkyl- and halosubstituted compounds. Other fatty and aromatic carboxylic acids may be employed to esterify a desired portion of the primary hydroxyls in the same manner. In a preferred embodiment of the compound of formula (II), about equal amounts of the $\alpha,\beta$-unsaturated monocarboxylic acid esters, aromatic monocarboxylic acid esters and aromatic anhydride half esters will be present in the compound of formula (II).

Since all practical methods for making the compounds of formula (II) involve a condensation polymerization of the initiator compound with a glycidyl compound (substituted alkylene oxide), one or more cyclic ethers can be polymerized with the glycidyl compound in this step. Suitable ethers include ethylene, propylene, butylene and styrene oxides, epichlorohydrin, tetrahydrofuran, oxetane, 2,2-bis(halomethyl)oxetane and the like. Such copolymers may be heteric (random), when the monomers are reacted simultaneously, or they may be block copolymers, wherein the monomers are reacted sequentially in any desired sequence and proportions. The number of oxyalkylene units in the polymer chains (the sum of m) in formula (II) may vary from 3 to many thousand, depending on the monomers and the catalyst used in its preparation. Preferred are compounds of formula (II) wherein y moles of ethylene oxides are condensed with z moles of TBGE, z being the sum of all m less y, where the ratio of y:z ranges from about 20:80 to about 90:10 and wherein the weight average molecular weight of the end product of formula (II) after esterification has taken place is from about 500 to 10,000. The compounds of formula (II) wherein y:z ranges from about 65:35 to about 75:25, wherein R is a residue of bisphenol A and at least one ester unit is the ester of acrylic or methacrylic acid are especially preferred for use in the invention. A compound of this nature with a weight average molecular weight of about 1,500-3,000 is especially preferred. Another preferred group of compounds of formula (II) are those wherein the y:z ratio ranges from about 20:80 to about 90:10 and wherein the weight average molecular weight is about 500 to about 10,000 and which comprise from 1 to 10 aromatic monocarboxylic acid esters and from 1 to 10 aromatic dicarboxylic acid anhydride half esters. In a most preferred embodiment, wherein the y:z ratio ranges from about 65:35 to about 75:25, R is the residue of bisphenol A, and the glycidyl units glycidol, glycidyl acrylate, glycidyl benzoate, and glycidyl phthalate half ester are present in about equal proportions.

The compounds of formula (II) are polymers which range from oily liquids to solids depending on the molecular weight, the nature of the initiator moiety and the identity, proportions and arrangement of the various other moieties therein.

2. The Gellation Process:

The reversibly gelled composition of the invention is prepared by contacting Component (a) and Component (b) or Component (a) alone where suitable, under gelling conditions with a dialdehyde. By the terms "gelled," "gelling," "gellable;" "gel" and the like, we mean that a liquid attains or is capable of attaining a state of matter ranging in firmness at ambient temperature from easily deformable by the application of pressure thereto, yet not voluntarily assuming the shape of its container, up to a firmness approaching that of what is commonly considered a solid and the state of matter in that form. Since the degree to which a composition is "gelled" is a subjective determination which varies the party determining same, an arbitrary method has been defined for determining relative firmness of gels by which one can identify those compositions contemplated herein suitable for forming a free radical-curable layer which may be processed, transported, or otherwise handled without rendering said layer unsuitable for the end use in which it is required. The test employs a modification of the standard durometer used in a Shore A hardness test and involves applying a probe member of a known cross sectional area to the surface of the gel with a known force and measuring the degree of penetration of this probe. The method is described in detail below under "V. Examples", but it suffices to say at this point that an indentation of less than about 10 mils is required of the gelled compositions. It is required that this limit be attainable within about 8 hours from the time of formulation of the "gelled" composition. Preferably, a firmness index of about 6 mils or less is attained within about 8 hours, but it is quite acceptable to allow natural maturation of the gel to bring about a decline to this preferred value within about 30 days.

In addition to gel firmness, a physical property termed "tack" has been devised to determine the suitability of said gels for our end use. Using the strip test described more fully below, a gel tack of less than about 8,000 gram-seconds per square inch must be attainable within about 8 hours, from the formulation of said "gelled" composition. Preferably a tack index of about 4,000 gramseconds per square inch or less is attained within 8 hours, but it is quite acceptable to allow natural maturation of the gel to bring about a decline to this preferred value within about 30 days. Tack, like firmness, is a property which determines the suitability of the material when processed, transported, utilized and otherwise handled.

By the term "free radical-curable" is meant that the gelled composition, when subjected to a free radical source, is capable of attaining a Shore A hardness of at least about 80 and is substantially no longer soluble in a solvent capable of reversing the gelled composition in an uncured state. The generation of this free radical source may be by any suitable method commonly known in the art such as by exposing the gelled composition to actinic radiation with or without the presence of free radical initiators and/or sensitizers. Free radical sources, initiators and sensitizers are described in more detail below.

The term "reversibly gelled" refers to a phenomenon wherein the composition will reach the firmness and tack desired under certain conditions but revert to a "more liquid" state by certain chemical treatment. The conditions for gellation and degelling vary slightly depending on whether the Z groups are all primary hydroxyls or all mercapto groups or mixtures thereof.

For the preferred polymeric compositions the gellation process is pH-reversible, hence the reference to "pH-reversibly gelled" composition. The term "pH-reversibly gelled" refers to a phenomenon wherein at a pH below about 7 the gelled composition is formed but at a pH greater than about 7 the firmness or tack indices rise above the limits described above. By alkalinedevelopable, is meant that the uncured portion of a free radical-curable gelled composition may be separated from the free radical-cured portion thereof by contacting with an alkaline solution, that is above about pH 7.

A mixture of Component (a) and Component (b) or Component (a) alone where appropriate, is gelled by contacting the same with a dialdehyde under acidic conditions, i.e. at a pH less than about 7. Preferably, the gel is formed by mixing the component, or a mixture of the components as the case may be, with a solution of the dialdehyde (described in more detail below) and adjusting the pH as necessary by the addition of organic or mineral acid. In the case where residual carboxylic acid is present in Component (a), or the Component (a) and (b) mixture, some gelling may be induced but generally it is necessary to supply additional acid sufficient to adjust the pH to between about 2 and 6 and preferably less than about 3.

The alkaline development of the free radical-uncured portion of a gelled composition is accomplished by contacting the exposed surface of said composition with an alkaline solution having a pH above about 7 and preferably from about 8 to 14. Slight agitation may be beneficially employed to remove the uncured portion as it "degels" and to expose more uncured material to the alkaline solution. This may be achieved by suitable mechanical means, as by a low pressure spray, or by the incorporation of an effervescent agent in the alkaline solution itself. The use of carbonate salt such as sodium carbonate, ammonium carbonate and the like, for rendering an alkaline solution may also give the beneficial effect of effervescent bubbling. It is preferred, however, to use aqueous solutions of alkali metal or alkaline earth metal hydroxides. Normally, a 1 to 10 weight percent and preferably 2 to 4 weight percent sodium hydroxide solution is used. More dilute solutions of sodium hydroxide give a slower wash rate, while with compounds wherein all Z groups are primary hydroxyls, concentrations above about 4 percent do not increase the wash rate sufficiently to justify the additional health and safety risks incurred.

3. The Dialdehyde:

The dialdehyde to be employed in forming the gelled composition may be suitably any dialdehyde for example, glyoxal, malonaldehyde, pyruvaldehyde, succinaldehyde, glutaraldehyde, adipaldehyde and similar homologs. The preferred dialdehyde for use in the invention is glyoxal because of its greater activity, easy availability and low cost. Glyoxal is not practically available as the isolated compound but as an aqueous or alcohol solution thereof. In such a form, glyoxal or other dialdehydes may be hydrated to hemiacetals or other forms. By the use of the term "dialdehyde," we mean to include such hydrated or alcoholated derivatives thereof which are suitably used under reaction conditions to link the mercapto groups or the primary hydroxyls found on the components of the instant invention, thereby forming the gelled composition.

In a preferred embodiment of the invention, where compounds of formula (II) are employed, the amount of dialdehyde employed, on an active weight basis, is suitably about 1 to 8 weight percent based on the weight of the compound of formula (II). A firmer gel may also be attained by increasing the number of primary hydroxyl groups present in the composition, as by adding supplemental unesterified polyglycidol to a system containing the compound of formula (II), and excess dialdehyde.

With the preferred embodiment employing a compound of formula (II) wherein the range of oxyethylene units to other glycidyl units ranges from about 65:35 to about 75:25, a firm, useful gel can be attained by the employment of about 4 to 8 active weight percent glyoxal based upon the weight of the compound of formula (II).

4. Other Additives:

It has already been mentioned above that polyglycidol may be added to supplement the compound of formula (II) and increase the firmness of the gel upon treatment with dialdehyde. Similarly, other compounds bearing multiple mercapto or primary hydroxyl groups such as Component (b), or polyols such as pentaerythritol, trimethylolpropane, or glycerol, may be added to increase the firmness of the gel even though Component (a) may be self-sufficient.

Besides such polyols, other additives are commonly employed in free radical-curable systems, and may be used in the various aspects of this invention for the beneficial effects for which they are well known in the art.

For example, known free radical generators, i.e., initiators, may be employed, with or without sensitizers for a particular source of actinic radiation. Such initiators are preferably thermally stable, at least at temperatures which might be encountered in normal transport and handling of a blank, e.g. at temperatures up to at least about 50° C, and preferably up to at least 100° C.

Exemplary photopolymerization initiators include benzoins such as benzoin, benzoin methyl ether, benzoin ethyl ether, isobutoxybenzoin, benzoin isopropyl ether, α-methylbenzoin, α-ethylbenzoin, α-methyl benzoin methyl ether, α-phenylbenzoin, α-allylbenzoin; anthraquinones such as anthraquinone, chloroanthraquinone, methylanthraquinone, ethylanthraquinone, tertiary butylanthraquinone; diketones such as benzil, diacetyl; phenones such as acetophenone, diethoxyacetophenone, benzophenone, ω-bromoacetophenone; 2-naphthalene sulfonyl chloride; disulfides such as diphenyl disulfide, tetraethylthiouram disulfide; dyes such as Eosine G (C.I. 45380) and Thionine (C.I. 52025); and the like. Where the only ethylenically unsaturated groups present are allylic, it is necessary to include some acrylic esters or acid if they are to be cured by common ultraviolet light sources unless some Z groups are mercapto groups.

These photopolymerization initiators are preferably used in an amount of from about 0.0001 to 10, preferably 0.2 to 3, parts by weight per 100 parts by weight of the photosensitive composition. Amounts of photopolymerization initiator of more than about 10 parts by weight do not significantly increase the photopolymerization reaction and would be uneconomical and further tend to decrease the mechanical properties of the photopolymerized products. On the other hand, when the amount of the photopolymerization initiator is less than indicated, the photopolymerization reaction is greatly retarded and is too slow for practical commercial purposes.

Also, known stabilizers may be employed for the purpose of enhancing storage stability (shelf life) of the photosensitive compositions and/or preventing accidental or undesired thermal crosslinking. Such stabilizers may be added when the components of the photosensitive composition are admixed or may be added to each component separately prior to admixing of the components, for example, during their manufacture.

Exemplary stabilizers include hydroquinone, mono-tert-butyl hydroquinone, 2,5-di-tert-butyl hydroquinone, catechol, tert-butyl catechol, benzoquinone, 2,5-diphenyl-p-benzoquinone, p-methoxy phenol, picric acid, cuprous oxide, cuprous halides, phenothiazine, mono-, di-, or trinitrobenzene, napthaquinone, compounds of the formula

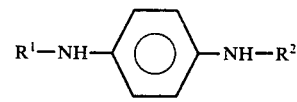

wherein $R^1$ and $R^2$ are each selected from the group consisting of hydrogen, lower alkyl having 1 to 4 carbon atoms, phenyl and naphthyl such as p-phenylenediamine, N,N'-diphenyl-p-phenylenediamine, and the like.

These stabilizers are added only for preventing thermal polymerization without the actinic radiation set forth above without unduly restraining the photopolymerization reaction. Consequently, the amount of the stabilizers may be preferably about 0.001 to 1 percent by weight of the total weight of the photosensitive composition.

Certain mono- or polyunsaturated materials such as glycerol acrylates, pentaerythritol acrylates, trimethylolethane or propane acrylates, diallyl ethers, diacetone acrylamide, and the like may be added to serve as cross-linkers, adding toughness and hardness in varying degrees, as desired. Some may also serve as reactive diluents which aid in the processability of the composition before gelling and cure. In a preferred embodiment wherein a compound of formula (II) is employed, for example, diacetone acrylamide, or any of the other N-3-oxyhydrocarbon-substituted acrylamides set forth in U.S. Pat. No. 3,794,494, in an amount ranging from about 5 to 25 weight percent of the compound of formula (II), is employed to add a toughness to the final articles in relief, as well as to render the gel composition easier to apply to the substrate during preparation of the blank.

Additionally, fillers, non-photocurable polymeric binders, pigments, small amounts of water, other solvents, plasticizing compounds, and the like may be added to the composition if desired. However, these additional components have definitely not been found necessary nor even particularly desirable, for the most part. Use of certain fillers, for example, may well contribute to the water swellability of certain prior art plates. Care should therefore be exercised in use of these various optional components lest the overall properties of the plate actually be detrimentally affected as a result of an attempt to modify one aspect.

B. Blank Fabrication

The manipulative steps per se employed in preparing the blanks, and subsequently, the articles in relief, are well known to those skilled in the art; the novelty lies in the improved reversibly gellable composition employed in the image layer. Accordingly, in this portion of the specification reference is sometimes made to what is known by those skilled in the art, followed by a discussion of a preferred embodiment. Because most of the discussion in this section is merely ancillary to the heart of the invention, these preferred embodiments are particularly to be regarded as merely illustrative and certainly non-limiting.

After formulating the gellable composition as hereinabove described, but before the gellation reaction has proceeded to the extent that the composition is, as a practical matter, unworkable, a layer of the composition is formed, herein sometimes referred to as the "image layer," or "photocurable layer", usually on a substrate which may be temporary or permanent. The substrate may be transparent, translucent, or opaque with respect to the actinic radiation. The thickness of the image layer will be determined by the end use to which the article in relief is to be put, and also in part by whether or not the substrate is temporary. If the substrate is temporary so that the article in relief will consist solely of the image layer, then of course the image layer should be sufficiently thick to possess the strength required. In any event, an image layer of substantially uniform thickness is desired, and may be achieved by, for example, doctoring and/or calendering the partially set gel composition onto the substrate. Extrusion may also be used, in which event the substrate can be eliminated altogether. For most practical applications, however, it is preferred to employ a permanent substrate.

The substrate may comprise a solid base having physical properties—especially dimensional stability—and geometry appropriate to the particular end use, as well as one or more layers interposed between the base and the image layer, if desired, for particular purposes as hereinafter discussed.

The base may be comprised of any substance which is solid and substantially inert (except, of course, for surface adhesive properties) under all conditions likely to be encountered during the useful life of the blank and, where the base is intended to be permanent, during the useful life of the article in relief. The base is preferably of substantially uniform thickness, and may be of non-flat, e.g., cylindrical, as well as flat configuration, but the latter is preferred because of the inherent difficulties in applying a uniform film to a non-flat surface. Depending on the ultimate objective, one skilled in the art will readily be able to select a suitable base material from among the many examples which abound in the art, among them being glass, ceramic materials, quartz, various films such as Mylar brand polyester film, metal foils, e.g., ferrous metals, aluminum, magnesium, and the like, as well as laminates of one or more of the foregoing. For blanks intended for use as direct printing plates, we prefer a metal foil having a thickness of from about 1 to 20 mils (25-500 microns). A ferrous metal base is particularly preferred since such blanks are adapted for easy mounting on presses equipped with magnetic saddles.

As hereinabove alluded to, at least one additional layer may be interposed between the base and the image layer as in the prior art, if desired, which layer or layers are selected to achieve particular results which may be desirable in certain circumstances. One of the two factors of most frequent concern is the control of halation. Where the image layer is between the base and the source of actinic radiation during imagewise exposure and the base is reflective of the actinic radiation, it is desirable to include an anti-halation layer sufficient to reduce the reflection from the base to the image layer to less than about 35 percent of the incident radiation. Suitable antihalation layers are taught in virtually every U.S. patent directly relating to plastic printing plates, at least since Plambeck, Jr., U.S. Pat. No. 2,760,863, the teachings of which are expressly incorporated herein. As an alternative to use of a separate anti-halation layer, an anti-halation agent may be directly incorporated into the image layer to control the amount of reflected radiation to tolerable levels, in a manner similar to that taught by Takimoto et al. in U.S. Pat. No. 3,801,328, and/or the surface of the substrate material may be chemically treated, e.g. with an oxidizer of phosphate, to reduce halation.

The second factor which is frequently modified using an intermediate layer is the extent of adhesion between the image layer and the base. Once again, many materials suitable for use in adhesion layers are found in the art. In the context of the present invention, it is preferred to employ as the adhesive, organic polymers having unreacted functionalities capable of chemical bonding reactions with the components of the image layer before, during, or after irradiation of the image layer. Since it is not normally necessary for the image layer to adhere with particular tenacity until after imagewise exposure of the blank, e.g., until a printing plate is about to be used in a press run, the adhesive may comprise a compound of formula (II) which is a homolog of another compound of formula (II) which is employed in the image layer. For example, when the gel contains substantial proportions of certain copolymers of glycidyl acrylate (and/or methacrylate) with alkene oxides, with a high proportion of the latter in the copolymer, the crosslinked gel tends to adhere poorly to many metal and organic surfaces. In this instance, a thin adhesive layer comprising a photoinitiator and a homologous copolymer containing a lower proportion of alkylene oxide units which homolog, when cured, adheres to the base better than the aforementioned homolog used in the image layer, can be applied to the base and irradiated in air so that the adhesive layer is substantially crosslinked except for the surface which the air prevents from becoming thoroughly crosslinked. The image layer is then applied and the uncured portion of the adhesive layer is crosslinked with the adjacent portion of the image layer during subsequent exposure. If desired, two different adhesive layers may be employed with an anti-halation layer sandwiched between, as may any other suitable combination of layers intermediate between the base and the image layer.

Where the base is intended to be temporary, a release layer, e.g. a silicon polymer, may be employed intermediate the base and the image layer.

For direct printing plates according to the present invention, it is preferred to employ a single intermediate layer of a carboxylated styrene-butadiene resin applied as a latex to a steel base, which intermediate layer is then partially cured, e.g. by baking for 3–5 minutes at 150°–175° C. This layer, generally about 0.1–2 mils (2–50 microns) thick, functions both as an adhesive layer and as an antihalation layer. As is well known in the art, a single combination antihalation and adhesive layer can also be obtained by providing in the adhesive, pigments, dyes, and/or other substances which absorb actinic radiation.

In applying the gellable composition to the substrate, the composition may be heated if desired. In one embodiment, for example, from a reservoir maintained at about 50° C., the composition is deposited on a continuously advancing substrate which is supported by a platen, and the composition is evenly distributed over the substrate by means of a doctor blade. Both the platen and the doctor blade may also be heated to a similar temperature. Suitable temperatures may vary somewhat depending on the particular composition employed, but those skilled in the art will have no difficulty in determining a suitable temperature. After application, setting of the gel can be accelerated by further heating, e.g. at about 60°–80° C. for 5–15 minutes, although the gel will also attain the requisite gel firmness and tack properties merely with the passage of time.

Unless the blank is to be used immediately, a protective moisture barrier film, such as saran, should be applied to the surface of the image layer. The protective film is desirable as an aid to storing the blanks which otherwise have a tacky surface, but is most important in preventing absorption of moisture from the ambient atmosphere. Also, of course, such a film affords some protection against accidental marring of the surface and prevents the surface from attracting dust particles. A film can be employed which also serves as an oxygen barrier. The film is generally applied to the image layer as a solid immediately after the layer has been cast, although where the blank is heated to accelerate setting of the gel, the film may be applied either before or after the heating step. If the film is applied prior to the heating step, the nature of the film and the temperature of the heating step must be selected so as to avoid melting or shrinkage of the film. Also, in selecting the temperature, consideration must be given to the temperature at which certain of the optional components of the blank may become unstable. To facilitate removal of the cover sheet prior to use of the blank, a relase agent, such as for example, certain silicone compounds, may be applied to the surface of the image layer or to the contacting surface of the cover sheet, or to a portion, e.g. an edge or corner, of either.

C. Preparation of the Article in Relief

Where an image-bearing transparency is employed as the means for imagewise modulating the actinic radiation, the protective film, if any, is normally removed and the transparency placed in intimate contact with the tacky surface of the image layer. The slight tackiness of the image layer surface is a distinct advantage since the transparency can be placed and maintained in intimate contact with the surface of the image layer without the use of a vacuum frame. If desired, a trace of a release agent may be applied to the transparency prior to application to the surface of the blank to aid in removal of the transparency after exposure. Where the imagewise modulation is provided by other means, e.g., a laser, the protective layer need not necessarily be removed prior to exposure. For that matter, the protective film may be left in place even where a transparency is used, but it is not recommended for two reasons. First, a vacuum frame or an equivalent will be required to hold the transparency against the film, and second, the resolution will suffer in the image produced in the blank because of the separation between the transparency and the surface of the actual image layer--i.e., the transparency will not be in actual intimate contact with the surface of the image layer.

The blank is exposed to imagewise modulated actinic radiation for a time sufficient to achieve a satisfactory, and preferably an optimal, solubility differential between the light and shadow areas of the image. Among other characteristics, underexposure can result in loss of shoulder profile and of features such as small highlight dots, whereas overexposure can result in failure to attain proper relief depth in small non-printing areas. Representative sources of actinic radiation include carbon arc lamps, mercury lamps of the super high, high, or low pressure types, xenon lamps, ultraviolet fluorescent lamps, sunlight, lasers, gamma sources, and the like, depending on the type and sensitivity of the free radical initiator(s) and/or sensitizer(s) employed in the composition. The precise length of imagewise modulated exposure time will vary depending upon the source and intensity of the radiation incident upon the blank. For a typical set of exposure conditions for the preparation of a direct printing plate, however, without having been bumped blanks comprised of the preferred compositions of the present invention require an imagewise modulated exposure comparable to that required by the leading commercially available blanks, excluding the time required for the pre-exposure ultraviolet bump of the commercial plates, e.g., using a modern ultraviolet fluorescent lamp source, on the order of from about 10 seconds to about 3 minutes, and usually about 1 minute or less.

The exposure time required for the present blanks can in some instances be reduced even further, e.g., by 50–75 percent, and a greater relief depth obtained in small, non-printing areas, by employing a thermal bump prior to exposure. This is to be distinguished from the ultraviolet bump usually given to the prior art plates. It is to be emphasized that in the present invention, the thermal bump is strictly optional. In contrast, it is believed necessary, or at least a customary practice in the printing industry, to bump the prior art plates, and this is done at a point where time is often of utmost urgency as a press deadline approaches, i.e., immediately prior to use. Not only has it now been found that a thermal bump, e.g., about 30 to 180 seconds at 80°–120° C (the stability of the various components again being considered when selecting the temperature of the bump), is effective in many instances, particularly on blanks nearly a year old, but it has also been found that the thermal bump is effective for at least about eight hours. Thus, rather than bumping each plate individually just prior to the use of each, a quantity of plates sufficient for an entire press run can be bumped at once during a slack period during the work shift, and thereafter allowed to cool to ambient temperatures prior to imagewise modulated exposure for safe, easy handling.

After imagewise exposure, the blank is developed by contacting the exposed layer with an appropriate solution as hereinabove described (under caption IV. A. 2. in connection with the discussion of the reversibility of the gel) to remove the portions of the image which were not exposed to a crosslinking amount of radiation. This step, normally requiring about 45–75 seconds for a direct printing plate, is conveniently carried out in a conventional spray-type plate developer apparatus using a mild nozzle pressure, e.g. 20–30 psi. The temperature of the wash is not particularly critical; ambient temperatures have been found to be quite satisfactory.

Next, the plate is rinsed in water to remove the developer solution and dried, e.g. blown dry with air which may be heated if desired to accelerate evaporation of the water. This step normally can be completed within a minute or so.

The final step in the preparation of an article in relief from a blank is a post-wash exposure of the entire image layer of the plate to a source of actinic radiation. This completes the crosslinking of the image layer composition to the extent necessary to provide the degree of hardness and toughness required for a particular application. As with the imagewise modulated exposure, it is difficult to state an all-purpose time requirement for this step because of the many variables which are involved which are readily recognized by those skilled in the art, including not only the radiation source and composition of the image layer, but also the end use of the article itself. For direct printing plates, this can normally be accomplished in about a minute using conventional sources of ultraviolet radiation, while about an additional minute may be required to attain pattern plate hardness, depending on the photocurable composition employed.

A blank is thus provided according to the present invention which, in the preferred embodiments, can be readily stored and transported, and which can be exposed, developed, dried, and post-wash cured within about five minutes--more rapidly and with fewer operations than any comparable solid plate heretofore commercially available. Moreover, the quality of the resultant photopolymeric relief is superior to that produced from previous solid blanks. The printing face is sharply defined, and accurately reproduces the image on the negative. The shoulder profile provides an initial vertical drop from the flat printing face so that its upper portion does not receive ink and print a falsely enlarged image; the shoulder then tapers smoothly and cleanly outward to provide a broad strong support for the image element. Halftone highlight dots are retained that are substantially smaller than present plates are capable of retaining, while at the same time adequate relief depth is maintained in very small shadow dots of the halftone image as well as in other small non-printing areas such as the enclosed bowls of fine type. Moreover, a satisfactory balance of the aforesaid desired factors can be attained even if the operator errs substantially from the optimum exposure. Thus, the plate affords exceptional processing latitude. Unlike other solid type photorelief plates the finished plate does not curl, embrittle or otherwise materially change when stored under ordinary conditions for long periods of time.

V. Examples

Specific examples further illustrating the practice of the present invention will follow a general description of the screening procedures typically followed.

In many instances, blanks having a Mylar film base and cover sheet, as well as blanks having a metal base, were prepared from substantially identical compositions, often from a common batch. The Mylar-based blanks were usually used in evaluation of the gel properties, usually within 8 hours of fabrication of the blank, and in the evaluation of the properties of the composition after exposure to actinic radiation. The metal-based blanks and some Mylar-based blanks were exposed to actinic radiation though a standard 65-screen combination test negative with half tone and line copy for evaluation of the image quality. Proofs were actually printed using some of the plates, but an actual printing test was not necessary to judge accurately the quality of the plate produced.

To measure the gel firmness, a durometer was constructed resembling a standard durometer used in Shore A hardness tests. The constructed durometer was comprised of: (a) a Starrett dial gauge, No. 656-441 having a 1-inch range with 1 mil scale divisions and including a hollow cylindrical plunger shaft having an internal diameter of 0.118 inch and an outer diameter of 0.156 inch, which shaft extended vertically through an annular anvil having a $\frac{3}{8}$-inch OD and a 3/16-inch ID; (b) a 250-gram weight mounted on top of the plunger; and (c) means for holding the gauge and sample. The force exerted by the plunger, including the 250 gram weight and the force exerted by an internal spring connected to the gauge, was about 370 grams. The total gauge weight, which is exerted on the sample surface through the anvil and the plunger, was about 530 grams. The anvil and plunger were brought to rest on the surface of the gel, and the difference in the respective depths of penetration of the anvil and plunger into the gel was read in thousandths of an inch on the gauge. The reading was used as a gel firmness index. It will be observed that in contrast to the Shore scales which ascend with increasing hardness, the foregoing gel firmness index descends as the actual gel firmness increases.

The gel tack was determined by manually calendering a Mylar film cover sheet onto a Mylar film backed blank. The cover sheet was several inches long, one-half inch wide, and marked with two parallel lines spaced two inches apart from one another traversing the width of the strip. The thus-formed sandwich was hung vertically, i.e. so that the long sides of the second strip were in a vertical plane and the marker lines horizontal. The top edge of the base and the gel were clamped to a fixed object. The top edge of the cover strip was peeled back from the gel, a 100-gram weight was attached at the top of the strip, and the weight smoothly released to fall, so that the strip was peeled off from the gel. (As soon as the weight is released, of course, the bottom edge of the sandwich swings upward, and the gel and the backing are then in an approximately horizontal plane, gradually returning to the original vertical position as the cover strip is peeled off.) Using an electronic stop watch, the time required for the one square inch (6.45 cm$^2$) portion of the strip between the marker lines to peel off was determined, and a quantitative measurement of gel tack thus obtained in units of gram seconds per square inch.

To measure the hardness of a crosslinked layer of the gel, a crosslinked layer was peeled from its temporary backing and the hardness of the layer determined on a standard Shore A hardness durometer. (Where necessary, a double layer of the crosslinked gel was used to attain the minimum sample thickness recommended for testing on the durometer.)

To evaluate the flexibility of the crosslinked gel, a sample was bent 180° around rods of decreasing diameter. Compositions which cannot be bent about a rod having a diameter 20 times the sample thickness without cracking or rupturing are regarded as too brittle or weak for use in direct printing plates, though more brittle compositions have utility in other articles in relief including pattern plates. Preferably, the composition can be bent about a rod having a diameter no more than 3 times the thickness of the photocured sample strip without harming the sample.

To evaluate resiliency or rebound rate of the exposed composition, a sample was placed under a microscope at an oblique angle, the surface moderately depressed with a stylus, the stylus removed, and the time measured for the depression to vanish.

The toughness of the exposed composition was subjectively evaluated based on the ease or difficulty of cutting through a sample or causing it to rupture by pressing upon it with a a stylus held at an angle nearly parallel with the surface of the sample.

Finally, the processing performance (i.e., exposure time, exposure lattitude, washout time, etc) and typographical quality attainable with the particular test formulation were evaluated by preparing a series of small photorelief plates on portions of the blank sample, using the aforementioned standard test negative, and then examining these plates under a microscope for shoulder profile, retention of fine image features, proper depth of relief in given image areas, cleancut, even washout, and general typographic quality.

EXAMPLE 1

To a closed reaction vessel equipped with heating means, an agitator, and a pressure gauge was added 100 parts by weight bisphenol A and, as reaction catalyst, two parts by weight potassium hydroxide. In a separate container, 9 mols of tert-butyl glycidyl ether (TBGE) per mole of bisphenol A in the aforementioned reaction vessel, were admixed with 20 mols of ethylene oxide (EO) per mole of bisphenol A. While the reaction vessel and contents were maintained at 130° C with constant agitation, an aliquot of the TBGE/EO mixture was charged to the reaction vessel. Shortly after the introduction of the TBGE/EO mixture, as unreacted ethylene oxide vaporized in the vessel an autogenous pressure rise was observable on the pressure gauge. Upon return of the autogenous pressure to ambience, thereby signifying substantial completion of the addition reaction, another aliquot of the TBGE/EO mixture was added, and so on, until the entire TBGE/EO mixture was reacted with the bisphenol A to form a bisphenol A initiated linear random TBGE/EO coplymer. The foregoing reaction mixture was neutralized, for example with hydrochloric or acidic acid, and filtered to remove any solids, such as salts formed during the neutralization.

In a five liter, three-necked round-bottomed flask equipped with an agitator, heating means, condenser, thermocouple, dropping funnel, and Dean star trap connected to a manometer and means for imposing a partial vacuum, 4389.4 grams of the above copolymer and 122.9 grams of p-toluenesulfonic acid were reacted with agitation at 100°–110° C for 7 hours at a pressure of about 30 millimeters of mercury. A total of 902 grams of isobutylene collected as primary hydroxyl groups were formed along the copolymer chain. Benzoic acid, 499.9 grams, was then charged to the flask and the reaction medium maintained at 100°–110° C for an additional 7 hours, during which 55 milliliters of water were collected.

Subsequently, a 2553 gram portion of the polymer product thus obtained was heated to 90° C, 393 grams phthalic anhydride were added and the mixture was agitated for 15 minutes, again at a pressure of about 30 millimeters of mercury. Polymerization inhibitors in the form of 0.825 gram each of cuprous oxide and cuprous bromide were added to the mixture and the pressure within the vessel was adjusted to about 100 millimeters of mercury. Acrylic acid, 352 grams, was added to the vessel, and the mixture was agitated for 2 hours at about 100° C. The weight of the polymer product was 3249 grams, some water having been lost during the course of the foregoing reactions.

Similar polymers were prepared in a like manner as summarized in Table I under the major portion headed "Polymer." Still others have been prepared in a manner similar to that described in the cross-referenced U.S. Pat. No. 4,014,854.

Continuing with the preparation of the intermediate formulation for the gel, the heat source was removed from the 3249 gram batch, 650 grams of diacetone acrylamide were added, and the mixture allowed to cool by heat loss to the ambient environment to a temperature of 70° C at which temperature a 39 gram quantity of Vicure 10 brand of 90% isobutoxybenzoin (Stauffer Chemical Co.) was added. This intermediate was subsequently admixed with glyoxal and applied to a substrate to provide a blank having a gelled image layer.

In a substantially similar manner, various additional components were added to complete other intermediate formations as summarized in Table I under the major portion headed "Additional Materials."

TABLE I
INTERMEDIATE FORMULATIONS

| Ex. | Initiator | Ratio Y:Z | POLYMER Average Mols of Each Pendant Moiety Per Mole of Polymer | | | | | Average Molecular Wt. of Polymer | Inhibitors[6] | ADDITIONAL MATERIALS PARTS PER 100 PARTS BY WEIGHT POLYMER | | | | |
|---|---|---|---|---|---|---|---|---|---|---|---|---|---|---|
| | | | BA[1] | PA[2] | AA[3] | —OH[4] | MA[5] | | | Vicure 10 | DAA[7] | DEAP[8] | MDEOA[9] | MAA[10] |
| 2 | BPA[11] | 67:33 | 2.03 | 2.03 | 2.2 | 3.0 | — | 2970 | $Cu_2O$, 250 $Cu_2Br_2$, 250 | 1.2 | 20 | — | — | — |
| 3 | BPA | 70:30 | 2 | 2 | 1.9 | 1.7 | — | 2560 | $Cu_2O$, 260 $Cu_2Br_2$, 260 | 1.2 | 20 | — | — | — |
| 4 | BPA | 67:33 | 2 | 2 | 2 | 3.2 | — | 2900 | $Cu_2O$, 250 $Cu_2Br_2$, 250 | — | 15 | 2 | 4.6 | 7.4 |
| 5 | BPA | 70:30 | 2 | 2 | 2.5 | 2.6 | — | 2980 | TBC[12], 480 | 1.2 | 20 | — | — | — |
| 6 | BPA | 80:20 | — | 2 | 2.34 | 2.06 | — | 2670 | $Cu_2O$, 580 | 1.2 | 20 | — | — | — |
| 7 | BPA | 70:30 | 1 | 2 | 2.7 | 2.72 | — | 2800 | $Cu_2O$, 560 $Cu_2Br_2$, 280 | 1 | — | — | — | — |
| 8 | $H_2O$ | 50:50 | — | — | 3.8 | 1.7 | 2 | 1600 | HQ[13], 15,000 | — | — | — | — | — |

NOTES:
[1]Benzoic acid
[2]Phthalic anhydride
[3]Acrylic acid
[4]Primary hydroxyls
[5]Maleic anhydride
[6]Parts per million based on weight of total reactants
[7]Diacetone acrylamide
[8]Diethoxyacetophenone
[9]Methyldiethanolamine
[10]Methacrylic acid
[11]Bisphenol A
[12]t-butyl catechol
[13]Hydroquinone

EXAMPLE 9

The intermediate formulation of Example 2 was maintained in a reservoir at 70° C and pumped from the reservoir to the inlet of a ½-inch, 29 element Ross ISG static mixing device by means of a No. 5 Zenith positive displacement metering pump preheated to 50° C. Simultaneously, a 69 weight percent aqueous solution of glyoxal was pumped from a reservoir maintained at 25° C to the same inlet to the mixer by a No. 178 Zenith metering pump. The latter pump and the mixing device were preheated to 50° C. The foregoing liquid streams were joined and thoroughly admixed upon passage through the mixing device. The two pumps were driven by a common drive member so as to provide a ratio of volumetric delivery rates such that 15 parts by weight of glyoxal solution were blended with each 121.2 parts by weight of the intermediate formulation. The resultant gellable photocurable mixture emerged from the mixer and was distributed just upstream from a steel doctor blade by means of a fishtail-shaped distributor device, onto a five-mil thick substrate of Mylar brand polyester film while the film was advancing under the doctor blade at a rate of six feet per minute. The doctor blade was spaced 0.04 inch above the advancing substrate, and was maintained at 50° C. The substrate passed over a preheating platen maintained at 50° C upstream from the doctor blade. A layer of the aforesaid mixture of substantially uniform thickness was thus applied onto the moving substrate, after which it was passed under a six foot bank of twelve 250-watt infrared heat lamps placed six inches above the applied layer, to provide a one minute heating period after application of the gel to the substrate. Thereafter, the semi gelled sample strip was maintained for ten minutes at 70° C in an air convection oven to further complete the gelling reaction. A cover film of five-mil polyester was then promptly laminated to the surface of the gelled photocurable layer. Throughout these operations, care was taken to assure that the light sensitive materials were not exposed to sufficient actinic light to cause any significant photocuring thereof.

The thickness of the photocurable layer was measured and found to be 0.0225±0.001 inch. Gel indicies were measured. The tack index ranged from 1030 to 1290 gram seconds per square inch. The gel firmness index was 6 mils.

Strips of the samples 24 inches long by three inches wide were cut and processed to produce blanks suitable for the preparation of photopolymeric relief printing plates.

The polyester cover film was stripped from one such blank. A standard 65-screen combination test negative with half tone and line copy was very lightly coated with lecithin on its emulsion side. The negative was laminated to the gel plate with its coated emulsion side in direct contact with the gelled layer and the laminate was placed in a vacuum exposure frame under 2 inches of vacuum.

The blank was exposed through the negative for seven minutes to ultraviolet light from a bank of 12 closely spaced fluorescent ultraviolet tubular lamps (F36 T12 BL HO) spaced about two inches above the blank. The surface on which the blank rested was black and tended to absorb ultraviolet light that passed through the sample. Following exposure, the negative was easily removed from the plate.

The unexposed portions of the gelled layer were removed by spraying the plate with a 3% aqueous solution of sodium hydroxide at ambient temperature at a nozzle pressure of 30 psi for 90 seconds while rotating the plate on a frame in a commercial plate developing apparatus. The plate was then rinsed with flowing cold water for about 30 to 60 seconds, blown dry with compressed air, and examined. In contrast to photopolymer plates presently on the market which commonly have relief images that are markedly swollen and distorted at this point, and which are easily damaged by the slightest touch, the freshly prepared plate showed only barely appreciable swelling and distortion and could withstand much less cautious handling without any damage.

The plate was maintained for five minutes at 70° C, which was more than adequate to thoroughly dry the plate. Finally, the plate was postcured by exposing it for three minutes to ultraviolet light from a Berkey-Ascor 5KW mercury vapor lamp, which was more than adequate to cure the photopolymeric relief image layer suitable for use in direct printing.

On a Vandercook model 219 proof press with an adjustable bed, proof prints were made from this and other virtually identical photo relief plates prepared simultaneously. Various printing impressions were tried on plates prepared as described using several types of paper and ink. All of the plates, each of which was characterized by an image relief of sharp definition and ideal geometry, and a resilient, rubber like printing surface capable of conforming to the microtexture of the paper, produced prints of excellent quality.

The used plates were stored without cleaning for many days, and then cleaned and examined. No evidence of any damage to the image relief or the properties of the polymerized layer could be found.

EXAMPLE 10

A combination antihalation and adhesive primer was prepared in the following manner. To 80 parts by weight of deionized water was added 0.8 part by weight of a 30 weight percent aqueous solution of a very low molecular weight sodium polyacrylate to act as a dispersant. Into this solution was gradually dispersed, using a high shear mixing blender, 120 parts by weight of titanium dioxide pigment powder. Into three parts by weight of this pigment dispersion was blended two parts by weight of a 45.3 percent solids styrene/butadiene (61 parts styrene, 37 parts butadiene and 2 parts fumaric acid) latex. The resultant white primer had a pigment-/binder weight ratio of 2:1.

A long strip of steel sheet, 6 mils thick and 3½ inches wide, and tin plated on both surfaces, was scoured with pumice on one surface, rinsed with water, and dried. To the scoured surface was applied the above primer composition using a one inch diameter number 24 wirewound rod applicator. The layer was dried at ambient conditions for approximately one hour, and then maintained in a circulating air oven at 150° C for four minutes. A smooth, dry white primer coating approximately 1 mil thick resulted.

A photocurable gel was applied to the substrate by employing substantially the same equipment, procedures, and conditions as were employed in Example 9, except as otherwise noted. The temperature of the pump delivering the intermediate formulation to the mixer was increased from 50° to 80° C. The ½ inch, 29 element mixing device maintained at 50° C in Example 9 was changed to a one inch, 14 element mixing device, which was maintained at 90° C. Instead of the number ½ Zenith metering pump at 50° C, a Ruska syringe-type pump maintained at 70° C was employed. The concentration of the aqueous solution of glyoxal was 68 weight percent glyoxal. The intermediate formulation was that of Example 3. The separate drives of the respective pumps were controlled so that the intermediate formulation stream and the glyoxal stream were admixed in the same weight ratio as in Example 9. The gellable mixture was distributed and doctored on the advancing steel substrate and subjected to infrared radiation as described in Example 9 after which the substrate bearing the image layer was passed through a set of calender rolls maintained at 95° C and having a gap at the nip of 32 mils. Simultaneously, a strip of Mylar brand polyester film having a 5 mil thickness and a 3½ inch width was also fed into the calender rolls in such a manner that the film was laminated to the semi-gelled photorelief blank layer to form a protective cover. Substantially no air bubbles were trapped between the protective cover and the image layer.

The laminated blanks were maintained at a temperature of 70° C for five minutes to accelerate the gelling reaction. The resulting gelled photocurable layer measured 0.0205±0.002 inch in thickness.

A sample strip from the run of this example was stored in the laboratory at ambient condition without exposure to actinic radiation for over 7 months. It was then processed in a manner similar to that described in Example 9, except that it was exposed to actinic radiation through the negative for only 3½ minutes, to produce a photorelief plate for direct printing. This plate was proof printed under substantially the same conditions as in Example 9, and superb printing results were once again obtained.

The steel substrate used in this example, as distinguished from the polyester substrate employed in Example 9, imparts additional strength and stability to the plate and permits the plate to be held on the press cylinder or bed by magnetic means as well as by mechanical locking mechanisms. Moreover, a steel substrate can be of a thinner dimension than substrates having less strength, and this allows more relief depth in a plate of a given total thickness and strength.

EXAMPLE 11

Following substantially the same procedures as in Example 10, a substrate was prepared by applying to a commercially phosphated steel sheet used as received, a 45.3 percent solids styrene/butadiene latex as described in Example 10; i.e., the pigment, dispersant, and additional water used in the primer formulation of Example 10 were all omitted in this instance, but the application and drying steps were the same.

While maintained at 70° C, 129 parts by weight of the intermediate formulation of Example 4, i.e. an amount sufficient to provide 100 parts by weight of the polymer, and 20 parts per weight of 68 weight percent aqueous glyoxal were admixed by kneading in a rubber bag. The resulting gellable composition was deposited on the advancing substrate, doctored, and exposed to infrared radiation in much the same manner as hereinabove described in Example 9. The substrate and image layer were maintained at 70° C for 10 minutes, after which a 5 mil Mylar brand protective sheet was applied by a roller.

Subsequently a photorelief plate was prepared from the blank. The protective cover was removed from the blank, and a test negative, very lightly coated with lecithin, was laminated into intimate contact with the surface of the image layer simply by passing the blank and the negative through a set of rubber wringer (i.e., laundry) rollers. The negative remained in uniform, intimate contact with the image layer surface without the use of a vacuum frame or an equivalent. Neither an ultraviolet nor a thermal bump was used prior to imagewise modulated exposure. With the negative still in place, the blank was exposed to the fluorescent light source described in Example 9 for a mere 30 seconds. The negative was easily removed after which the plate was developed by spraying a 3% aqueous sodium hydroxide solution against the exposed surface for one minute at a nozzle pressure of 20 psi in a single nozzle laboratory type washout apparatus. The plate was removed from the apparatus, and rinsed for 15 seconds in cold tap water. Most of the water was removed from the relief surface by directing compressed air against the surface for approximately 10 seconds. The plate was further dried for about 35 seconds in a stream of air heated to 100° C. Finally, the plate was subjected to a one minute post-wash cure by direct exposure 7 inches from the bottom of a 5KW Berkey-Ascor mercury vapor lamp.

With a total processing time of only about 3½ minutes, an excellent printing plate was produced. A superb shoulder profile dropping straight down from the printing surface for a few mils and then flaring cleanly to a broad strong base was observed. The printing faces were sharply and faithfully defined. There was ample relief depth in the bowls of type characters, shadow dots, small reverses, and similar features. All 65-line halftone highlight dots with diameters of 2.7 mils or greater were retained. The surface of the plate was tough and resilient. The relief image recovered completely from severe deformation, and withstood remarkable abuse without detrimental effects. The adhesive layer in the substrate, although clear, performed in a very satisfactory manner not only as an adhesive layer, but also as an anti-halation layer.

EXAMPLE 12

Using another blank prepared as described in Example 11, a plate was prepared using an imagewise modulated exposure time, again without a bump of any sort, of one minute. With this slightly longer exposure time, even better results were obtained: in a 65-line halftone, highlight dots more than 1.9 mils in diameter were faithfully retained. A comparable percent-of-halftone dot can be retained using finer screens, such as 133-line screens.

EXAMPLE 13

An intermediate formulation similar to that described in Example 4 was prepared, except that the methyldiethanolamine and methacrylic acid were omitted from the formulation. Blanks were cast and plates were prepared as described in Example 11 with two exceptions. The intermediate formulation:glyoxal solution weight ratio was 117:20, and the plate was exposed through the negative for two minutes. The results obtained were substantially those reported for Example 12.

EXAMPLE 14

In a rubber bag, 121.2 parts by weight of the intermediate formulation of Example 5 and 15 parts by weight of 67 percent aqueous glyoxal were admixed by hand at 70° C. A portion of this gellable composition was pressed at 8000 psi for five minutes at 100° C between two 6-inch square sheets of 5 mil Mylar brand film spaced apart by a 31 mil thick shim frame. The pressed article was removed and allowed to cool to an ambient temperature. The top sheet of film was removed and the remaining image layer and substrate were maintained at 70° C for five minutes.

After exposure to actinic radiation, the cured film had a Shore A hardness of about 90–95, and exhibited good to excellent toughness. A layer of the cured polymer could be bent about rods of extremely small diameter, i.e., a cured layer could withstand virtually anything short of folding flat with a sharp crease. When deformed, the cured polymer was sufficiently resilient to rebound in about 7 seconds at room temperature, and a faster rebound rate would be anticipated at press temperatures. Although this particular example was run prior to articulation of the quantitative standards hereinabove described for evaluating the gel, it was subjectively judged at the time as exhibiting good gelling behavior.

A sample blank was exposed through a negative using a reflector modified Berkey-Ascor 5KW 20 × 30 vacuum printer (BAPR) for 8 lux or 12 seconds. The plate was developed by contact with a 3 weight percent sodium hydroxide spray for 45 seconds as hereinabove described. The image quality of the finished plate was very good.

EXAMPLE 15

Following substantially the same procedure as described in the preceding Example, 121.2 parts by weight of the intermediate formulation of Example 6 were admixed with 13 parts by weight of 67 weight percent aqueous glyoxal. The shim frame in this particular example had a thickness of 25 mils, and the temperature of the press was 100° C. The gel firmness was subjectively judged as good and the gel tack was found to be slight. A sample exposed to 65 lux from each side, using the apparatus described in the preceding example, exhibited a Shore A hardness of about 78–80, which is marginal for direct printing plate applications. The minimum diameter rod about which the cured polymer could be bent without damage was 0.1 inch, also somewhat marginal considering the approximately 25 mil thickness of the layer. However, the cured polymer was found to rebound after deformation almost instantaneously. Another blank prepared in a similar manner was placed on a semi-bright aluminum surface and it was exposed through a test negative to 25 lux units using the apparatus described in the preceding example. Using a spray of 3% sodium hydroxide, the plate was developed in 60 seconds with a nozzle pressure of 30 psi. The plate was subjected to a post exposure cure of 45 lux units, which required approximately 63 seconds. The image quality was rated as clean-cut and generally excellent in all respects. The penetration for both letter characters and shadows was very good.

EXAMPLE 16

In a manner similar to that described in the preceding Example, 101 parts by weight of the intermediate formulation of Example 7 and 10 parts by weight of 67% aqueous glyoxal solution were admixed by hand at 60° C and the resulting gellable composition was pressed between Mylar brand films separated by a 21-mil shim at a pressure of 7000 psi and temperature of 100° C for five minutes. The article was allowed to cool, the cover sheet removed, and the image layer and substrate were heated at 60° C for five minutes. Gel firmness and gel tack were both regarded as very good. A sample of the film was exposed to 65 lux units from each side of the image layer, and the cured composition exhibited a Shore A hardness of 81 to 88 when determined under dry (i.e. not humid) conditions, and 81 to 82 under humid conditions. The cured polymer rebounded from deformation within about 1 second under dry conditions, 0.2 second in humid conditions. It could be bent about a rod of 0.06 inch without damage in a dry environment, 0.08 inch in a humid environment. The cured polymer was found to be somewhat tender when probed with a stylus, especially under humid conditions. A blank was exposed through a negative to 20 lux units using the light source in the preceding example. The image layer had only a slight tack at the time of the exposure, so a vacuum frame was used with 6 inches of vacuum to hold the negative in place. The plate was developed in a 3% sodium hydroxide spray as hereinabove described for 60 seconds. The image quality of the plate was judged to be excellent. Once again, penetration of the type as well as on the shadows was excellent.

EXAMPLE 17

This example is virtually identical to that of Example 16, except that the intermediate formulation employed also contained 20 percent by weight diacetone acrylamide, and a proportionately greater amount of the intermediate formulation was employed to provide 100 parts by weight of the polymer composition. Also, the materials were mixed at and baked at 70° C rather than 60° C, and the shim thickness was 30 mils. A blank exposed to 65 lux units from each side had a Shore A hardness under dry conditions of 88–95 and under more humid conditions, 90–95. When in a dry environment, the cured polymer exhibited a rebound following deformation of 5 seconds, whereas in humid conditions, the time was doubled. The cured image layer could be bent about a 0.05 inch rod without damage in a dry environment, and was judged to have good to excellent toughness. A blank was exposed through a negative to 14 lux units and developed using a spray of 3% sodium hydroxide at 70° F and 40 psi nozzle pressure for 50 seconds. After the wash, the plate was exposed to an additional 41 lux units. Some bubbles were microscopically observed in the cured polymer, but nevertheless, the image quality was fairly good.

EXAMPLE 18

A substrate of 0.05 inch thick aluminum alloy sheet was alkaline cleaned, passivated briefly in 20% nitric acid, rinsed and dried. One part by weight of a carboxy-terminated polybutadiene polymer was dissolved in 7 parts by weight of methyl ethyl ketone, applied to the substrate with a number 12 wire-wound rod, air dried, and baked 5 minutes at 175° F to a faintly tacky, semi-cured state.

One part by weight of Vicure 10 initiator was mixed evenly into 100 parts by weight of the intermediate formulation of Example 8, and the mixture was warmed to 60° C. Fifteen parts by weight of a 40 weight percent aqueous solution of glyoxal at 60° C was mixed evenly into the above mixture. The resultant mixture at 60° C was spread by a doctor blade (also at 60° C) spaced approximately 1 mm above the substrate to form an even layer of viscous liquid composition on the substrate. The viscosity of the composition increased as the layer cooled rapidly, and lateral flow of the composition was substantially avoided. The resultant article was baked for 40 minutes at 60° C and the layer gelled into a rubbery solid form.

A photographic negative transparency was applied to the surface of the layer by means of a roller so that the photographic emulsion was uniformly in direct contact with the layer. The properties of the layer surface were such that the negative clung to it spontaneously. The layer was exposed through the negative to a 5 KW Addalux 1406-05 brand mercury vapor light in a modified Berkey Ascor 30 × 40 Vacuum Printer for 75 seconds. The negative was cleanly peeled from the layer without difficulty. The exposed layer was sprayed with an aqueous solution of 3% NaOH at 21° C with a nozzle pressure of 30 psig for 140 seconds, rinsed briefly in running water and examined. The photopolymer relief image, even at this stage of processing, was firm, not easily damaged, and showed no distortion or other evident detrimental effects of the washout treatment. The plate was then dried in a stream of air at 100° C for about a minute and was further exposed directly to the same light source for one minute to further cure the photopolymer. After such additional curing the photopolymer was still firmer and tougher and had a Shore A hardness of 98, yet remained flexible, resilient, and adherent to the substrate. Over 2 months later, its physical properties remained substantially unchanged.

Microscopic examination and measurements showed the relief imge to be of excellent quality. Open non-image areas between linework were washed out cleanly to the substrate primer to provide approximately 0.7 mm of relief. The image characters had smooth, clean-cut shoulders that tapered outward to form broad supporting bases at the substrate primer, or merged with those of adjacent elements. Relief depth in small non-image areas between image elements was ample to meet printing requirements. The original image on the negative was reproduced with virtually perfect accuracy and fidelity in the printing face of the photopolymer relief image. Image elements as small as halftone highlight dots 0.0012 inch in diameter were faithfully retained and perfectly formed. This is in marked contrast to some commercial plates in which significant changes from original image size or shape occur. Moreover, it is believed that use of negatives having image elements smaller than .004 inch in diameter is not recommended by firms presently having plates on the market for use in printing newspapers, because in contrast to the present invention conventional plates and processes cannot be relied upon to retain such elements during washout or other removal of unexposed portions of their photocurable layers.

The plate was proofed directly at a newspaper printing plant using standard newspaper ink, newsprint, and techniques. The print quality was superior to that typically obtained with stereotype printing plates. Except for irregularities attributable to the coarseness of the newsprint, the printed image was faithful to the original image including the small highlight dots mentioned. The plate was not detectably affected by the ink.

A mat was made from the plate and a flat stereotype plate was cast from the mat using the standard commercial materials, equipment, and techniques normally used with cast type and engraved metal relief plates. A proof made in the same manner from the stereotype duplicate of the plate when compared with the proof made directly from the original photopolymer showed losses in print quality and fidelity substantially typical of, and inherent in, the stereotype platemaking process itself regardless of the type of original plate employed. Even so, even the original 0.0012 inch diameter highlight dots were reproduced ± approximately 0.0004 inch in diameter. The plate incurred no significant damage in being matted.

EXAMPLE 19

A base of 0.009 inch thick aluminum alloy sheet was alkaline cleaned, passivated in 20% nitric acid, rinsed and dried. A primer was prepared by dispersing 65 parts by weight $TiO_2$ into 35 parts by weight of water containing 0.13 part by weight of a 30 percent aqueous solution of very low molecular weight sodium polyacrylate and blending this dispersion with sufficient carboxylated styrene/butadiene latex (45.3% solids) to yield a pigment binder ratio of 59/41. The primer was applied to the base with a number 20 wire-wound rod, air dried, and baked 4 minutes at 150° C to give a dried coating approximately 0.0005 inch thick.

Ten parts by weight of water, 0.006 part by weight of acid fuchsin dye, and 0.9 part by weight of Vicure 10 initiator were uniformly admixed with 100 parts by weight of the intermediate formulation of Example 8 and the mixture was warmed to 60° C. Fifteen parts by weight of a 40% aqueous solution of glyoxal at 60° C was rapidly and evenly mixed into the above mixture. The mixture was held at 60° C in a closed container for 3 to 4 hours whereupon its viscosity, when the admixture was cooled to room temperature, was found to have been reduced to spreadable, honey-like consistency.

The mixture at room temperature was spread by a doctor blade spaced approximately 0.9 mm above the level primed surface of the substrate to form an even layer thereon. After standing at room temperature over a weekend, the layer had gelled into a rubbery solid form. The resultant article was heated at 60° C for 30 minutes.

A photopolymeric relief printing plate was made from the above in the same manner as was described in Example 18 except that exposure time was 65 seconds, washout or development was for 60 seconds at about 24° C with a nozzle pressure of 20 psig, and 90 seconds additional exposure was given for further curing.

Microscopic examination and measurements showed the photopolymeric relief image to be substantially of the same excellent quality as that obtained in Example 18. Where the layer was removed down to the primed substrate, relief depth was approximately 0.53 mm. The lavender color of the dyed polymer image gave visual contrast to the white primer. The primer was flexible and afforded good adhesion to both the aluminum substrate and the polymer image.

EXAMPLE 20

The following polymercapto compounds were reversibly gelled by mixing about 100 parts of the compound with 15 parts of 70% aqueous solution of glyoxal and then adding 2-3 drops of 37% aqueous HCl. Relatively firm gels formed almost immediately upon addition of the acid. The gels formed above were then contacted with an aqueous solution of about 10% sodium hydroxide which caused them to return to the liquid state. The compounds gelled and degelled in this manner were:

(1) a tetrakis(mercaptopropionate) of pentaerythritol obtained from Cincinnati Milacron Chemicals Inc. under the name of Mercaptate Q43 Ester;
(2) a water initiated 50—50 ethylene oxide - TBGE copolymer which had been completely dealkylated and thereafter about half the primary hydroxyls esterified with mercaptoacetic acid to give a viscous liquid polymer of about 1150 molecular weight and about 4.4 mercapto and 4.4 primary hydroxyl groups per molecule; and (3) a methanol initiated TBGE homopolymer which was completely dealkylated then completely esterified with mercaptoacetic acid to give a liquid polymer of about 600 molecular weight having about 4.5 mercapto groups per molecule.

What is claimed is:

1. A reversibly gelled composition, which is free radical-curable in an imagewise fashion by exposure to imagewise modulated actinic radiation and thereafter developable to form an article in relief, which gelled composition is a reaction product of a composition comprising:

Component (a) a first organic polymer bearing, per molecule, at least one ethylenic unsaturated group which is polymerizable by a free radical source; and Component (b) a second organic polymer bearing, per molecule, at least two Z groups, wherein each Z is independently primary hydroxyl or mercapto; with the proviso that when Component (a) bears at least two Z groups per molecule, Component (b) may be omitted.

2. The composition of claim 1 wherein Component (a) bears at least two Z groups per molecule and Component (b) is omitted.

3. The composition of claim 1 where the Z groups are all primary hydroxyls.

4. The composition of claim 1 wherein at least one ethylenically unsaturated group is present in the form of an acrylate, methacrylate, acrylamide or methacrylamide group.

5. The composition of claim 1 wherein the dialdehyde glyoxal is employed to produce said reversibly gelled composition.

6. The reversibly gelled composition of claim 1, further characterized as pH-reversibly gelled, wherein Component (a) is represented by the formula

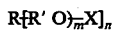

wherein R is the residue left by removal of $n$ active hydrogen atoms from an initiator compound, $RH_n$, each R' independently is an alkylene radical selected from the group consisting of ethylene, trimethylene, tetramethylene, 1,2-butylene, 2,2-bis(halomethyl)-1,3-propylene, and groups of the formula

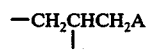

each A independently is H, Cl, Br or OX, each X independently is H or an acyl radical of a carboxylic acid with the proviso that at least two R' are 3-hydroxy-1,2-propylene and at least one R' is a group of the formula

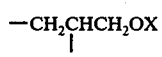

wherein X is an acyl radical of an $\alpha,\beta$-unsaturated carboxylic acid, each $m$ independently is a positive integer and $n$ is an integer from 1 to 8.

7. The composition of claim 6 wherein R is the residue of a hydroxy compound free of groups other than OH that are reactive with an alkylene oxide.

8. The composition of claim 6 wherein $n$ is 2.

9. The composition of claim 6 wherein R is an aromatic residue.

10. The composition of claim 9 wherein R is the residue of bisphenol A.

11. The composition of claim 6 wherein the dialdehyde glyoxal is employed to produce said pH-reversibly gelled composition.

12. The composition of claim 6 wherein each R' independently is ethylene or a group of the formula

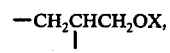

$y$ represents the number of R' that are ethylene, $z$ represents the sum of all $m$ less $y$, and the ratio of $y:z$ ranges from about 20:80 to about 90:10 and wherein the average molecular weight of Component (a) is from about 500 to about 10,000.

13. The composition of claim 12 wherein $y:z$ ranges from about 65:35 to about 75:25, R is the residue of bisphenol A, and in at least one

X is the acyl radical of acrylic or methacrylic acid.

14. The composition of claim 12 wherein the average molecular weight of Component (a) is from about 1500 to about 3000.

15. The composition of claim 12 wherein Component (a) comprises from 1 to 10 R' groups of the formula

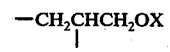

wherein X is the acyl radical of an aromatic monocarboxylic acid; and from 1 to 10 R' groups of the formula

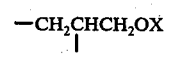

wherein X is an acyl radical of an aromatic dicarboxylic acid.

16. The composition of claim 15 wherein $y:z$ ranges from about 65:35 to about 75:25, R is the residue of bisphenol A; and of the R' units wherein R' is not ethylene, R' is represented by the formula

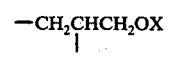

wherein X, in about equal occurrences is H, the acyl radical of acrylic acid, the acyl radical of benzoic acid and an acyl radical of phthalic acid and the dialdehyde is glyoxal which is present in about 4-8 weight percent of Component (a).

17. A process for preparing the reversibly gelled composition of claim 1 comprising contacting, under gelling conditions, with a dialdehyde in an amount sufficient to induce gelling, a polymeric composition comprising Component (a) a first organic polymer bearing, per molecule, at least one ethylenically unsaturated group which is polymerizable by a free radical source; and Component (b) a second organic polymer bearing, per molecule, at least two Z groups, wherein each Z is independently primary hydroxyl or mercapto;

with the proviso that when Component (a) bears at least two Z groups per molecule, Component (b) may be omitted.

18. The process of claim 17 wherein the dialdehyde is glyoxal.

19. The process of claim 17 wherein Component (a) is represented by the formula $$R[(R'O)_m X]_n$$

wherein R is the residue left by removal of $n$ active hydrogen atoms from an initiator compound, $RH_n$, each R' independently is an alkylene radical selected from the group consisting of ethylene, trimethylene, tetramethylene, 1,2-butylene, 2,2-bis(halomethyl)-1,3-propylene, and groups of the formula $$-CH_2CHCH_2A$$

each A independently is H, Cl, Br or OX, each X independently is H or an acyl radical of a carboxylic acid with the proviso that at least two R' are 3-hydroxy-1,2-propylene and at least one R' is a group of the formula $$-CH_2CHCH_2OX$$

wherein X is an acyl radical of an $\alpha,\beta$-unsaturated carboxylic acid, each $m$ independently is a positive integer and $n$ is an integer from 1 to 8.

20. The process of claim 19 wherein the dialdehyde is glyoxal.

21. The process of claim 19 wherein $n$ is 2, R is the residue of bisphenol A and y, a positive integer, represents the number of R' that are ethylene and z represents the sum of all $m$ less $y$, the ratio of $y$:$z$ ranges from about 20:80 to about 90:10 and the weight average molecular weight of Component (a) is from about 500 to about 10,000.

22. A reversibly gelled composition which is free radical-curable in an imagewise fashion by exposure to imagewise modulated actinic radiation and thereafter developable to form an article in relief, comprising:

Component (a) a first organic polymer bearing, per molecule, at least one ethylenic unsaturated group which is polymerizable by a free radical source; and Component (b) a second organic polymer bearing, per molecule, at least two Z groups, wherein each Z is independently primary hydroxyl or mercapto, with the proviso that when Component (a) bears at least two Z groups per molecule, Component (b) may be omitted;

wherein Z groups in the reversibly gelled composition have been linked with a dialdehyde under acidic conditions.

* * * * *

UNITED STATES PATENT AND TRADEMARK OFFICE
CERTIFICATE OF CORRECTION

PATENT NO. : 4,072,529

DATED : February 7, 1978

INVENTOR(S) : Clayton W. Hoornstra; Violete L. Stevens

It is certified that error appears in the above-identified patent and that said Letters Patent are hereby corrected as shown below:

On the title page in the second column, third line down, it should read as follows:
4,006,068   2/1977   Stevens..................204/159.11

On the title page in the second column, fourth line down, it should read as follows:
4,014,854   3/1977   Stevens et al. ..........204/159.11

Column 2, line 59, omit "to" and insert -- of --.

Column 7, line 30, the word "tertiaryl-" should read instead, -- tertiary- --.

Column 7, line 56, the line should read as follows: "the acid. If one attempts to totally esterify such an acid".

Column 8, line 16, instead of "polymerized", it should read -- copolymerized --.

Column 8, line 29, the word "oxides" should read -- oxide --.

Column 9, line 3, add the word -- with -- between the words "varies" and "the".

Column 9, line 32, instead of "gramseconds", it should read -- gram-seconds --.

UNITED STATES PATENT AND TRADEMARK OFFICE
CERTIFICATE OF CORRECTION

PATENT NO. : 4,072,529

DATED : February 7, 1978

INVENTOR(S) : Clayton W. Hoornstra; Violete L. Stevens

It is certified that error appears in the above-identified patent and that said Letters Patent are hereby corrected as shown below:

Column 9, line 66, "kalinedevelopable" should read instead -- kaline-developable --.

Column 10, line 5, delete the word "the".

Column 11, line 47, "0.2" should read instead -- 0.3 --.

Column 19, line 26, "coplymer" should read -- copolymer --.

In Table I, line 42, "Y:Z" should be instead -- y:z --.

Column 21, line 3, "No. 178" should read -- No. 1/2 --.

Column 26, line 15, between the words "the" and "plate", should be inserted the word -- finished --.

Column 27, line 24, "imge" should read -- image --.

Column 29, line 16, should read -- composition is a reaction product of a process comprising contacting a dialdehyde with a polymeric composition --.

UNITED STATES PATENT AND TRADEMARK OFFICE
CERTIFICATE OF CORRECTION

PATENT NO. : 4,072,529
DATED : February 7, 1978      Page 3 of 3
INVENTOR(S) : Clayton W. Hoornstra; Violete L. Stevens It is certified that error appears in the above-identified patent and that said Letters Patent are hereby corrected as shown below:

Column 29, line 45, "$R\mathsf{+}R'O)_m X]_n$" should read instead -- $R\mathsf{+}(R'O\mathsf{+}_m X]_n$ --.

Column 31, line 21, "$R\mathsf{+}R'O\mathsf{+}_m X]_n$" should read instead -- $R\mathsf{+}(R'O\mathsf{+}_m X]_n$ --.

Signed and Sealed this

Twenty-second Day of January 1980

[SEAL]

Attest:

SIDNEY A. DIAMOND

Attesting Officer      Commissioner of Patents and Trademarks